(12) United States Patent
Ishida

(10) Patent No.: US 7,229,499 B2
(45) Date of Patent: Jun. 12, 2007

(54) MANUFACTURING METHOD FOR SEMICONDUCTOR DEVICE, SEMICONDUCTOR DEVICE AND SEMICONDUCTOR WAFER

(75) Inventor: Masahiro Ishida, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 106 days.

(21) Appl. No.: 10/921,913

(22) Filed: Aug. 20, 2004

(65) Prior Publication Data

US 2005/0039673 A1 Feb. 24, 2005

(30) Foreign Application Priority Data

Aug. 22, 2003 (JP) ............................. 2003-298478

(51) Int. Cl.
*C30B 25/12* (2006.01)
(52) U.S. Cl. ............................. 117/89; 117/96; 372/45
(58) Field of Classification Search ................ 117/89, 117/96; 372/45
See application file for complete search history.

(56) References Cited

U.S. PATENT DOCUMENTS 6,266,355 B1   7/2001  Sverdlov 7,078,814 B2   7/2006  Stamper
2006/0166486 A1   7/2006  Stamper

FOREIGN PATENT DOCUMENTS

| DE | 10102126 A1 | 6/1998 |
| DE | 19652543 A1 | 8/2002 |
| JP | 59121183 A | 7/1984 |
| JP | 11-074621 | 3/1999 |
| JP | 3201475 | 6/2001 |
| JP | 2002-009341 | 1/2002 |

OTHER PUBLICATIONS

English language Abstract of JP 11-74621.
English language Abstract of JP 2002-9341.

*Primary Examiner*—Felisa Hiteshew
(74) *Attorney, Agent, or Firm*—Greenblum & Bernstein, P.L.C.

(57) ABSTRACT

A manufacturing method for a semiconductor device formed in a device region composed of a plurality of semiconductor layers on a substrate, the method including a trench forming step of forming a trench on the substrate around the device region and a semiconductor growth step of growing the semiconductor layer in the device region.

12 Claims, 15 Drawing Sheets

MANUFACTURING METHOD FOR SEMICONDUCTOR DEVICE, SEMICONDUCTOR DEVICE AND SEMICONDUCTOR WAFER

BACKGROUND OF THE INVENTION (1) Field of the Invention

The present invention relates to a manufacturing method for a semiconductor device, in particular to a manufacturing method for a III group nitride semiconductor device having heterojunction, such as a light emitting diode (hereafter referred to as LED) in a visible range to an ultraviolet range, a semiconductor laser in a visible range to an ultraviolet range, or a high-speed transistor, and relates to a semiconductor device and a semiconductor wafer manufactured by the III group nitride semiconductor having the heterojunction.

(2) Description of the Related Art

The III group nitride semiconductor made of GaN, InN, AlN or an alloy composed predominantly of these materials is a semiconductor material that can form a hetero-structure of a wide band-gap having an energy gap corresponding to a wave range from a visible light to an ultraviolet radiation. Therefore, it is a preferred material for a LED, a semiconductor laser, a high-speed transistor which can operate in a high temperature environment, and the like.

The III group nitride semiconductor using such as GaN is often grown on a substrate made of different materials such as sapphire and SiC. Therefore, a distortion is generated when it grows because of differences of a grating constant and a thermal expansion coefficient between the substrate and a III group nitride growth layer. Or, when the hetero-structure made of AlGaN or InGaN is formed on GaN, the grating constant and the thermal expansion coefficient are different among GaN, AlGaN and InGaN so that a distortion is generated at the time of the growth. When such distortion is deposited and a limit is reached, a crack is generated on the growth layer. Accordingly, various counter-measurements are taken.

For example, Japanese Laid-Open Patent Publication application No. H11-74621 (related art 1) discloses a technology of moderating a distortion using InGaN for one of the layers which forms a light confinement hetero-structure. The other, Japanese Laid-Open Patent Publication application No. 2002-9341 (related art 2) discloses a technology of moderating a distortion by forming a III group nitride layer on a p-GaN having concavo-convexes.

According to the method, it is possible to thicken a thickness of the growth layer by moderating the distortion and to grow a growth layer which even has a large compositional difference with the base without generating a crack.

However, with the conventional structure, the distortion can be reduced but the crack is propagated to a semiconductor device and a semiconductor substrate when the growth layer grows as much as causing a distortion larger than a destruction limit. Also, there is a limitation for a combination of the base and the growth layer.

Furthermore, in the case where a semiconductor material with a film hetero-structure using InGaN is applied to a light-emitting device with a short wavelength such as a purple light to an ultraviolet radiation, an InGaN layer works as a light absorption layer so that a light-emitting efficiency remarkably declines and an high-efficient semiconductor device cannot be acquired. Further, by a method of forming concavo-convexes on p-GaN which has a base structure, the p-GaN which has an electrical conductivity is used for a base layer so that, when the method is applied to a high-speed transistor, a maximum operation frequency is declined.

SUMMARY OF THE INVENTION

Considering the problems mentioned above, it is an object of the present invention to provide, even when a semiconductor layer grows as much as causing a distortion larger than a destruction limit, a manufacturing method for a semiconductor device capable of moderating an influence of a crack and forming a semiconductor device with a high yield, and a manufacturing method for a semiconductor device and a semiconductor substrate that can preventing the crack generation.

In order to achieve the object mentioned above, the manufacturing method for the semiconductor device according to the present invention formed in a device region that is composed of a plurality of semiconductor layers, comprises a semiconductor growth step of growing a semiconductor layer in the device region on a substrate on which a trench is formed around the device region.

Accordingly, the trench is formed and the influence of the generated crack is moderated so that the semiconductor device with the high yield can be manufactured Further, the manufacturing method for the semiconductor device according to the present invention can be more preferably, wherein in the semiconductor growth step, that a trench is formed on the substrate inside the device region before the semiconductor layer is grown and that the semiconductor layer grown in the semiconductor growth step is embedded nearly flat.

Consequently, together with the formation of the semiconductor device with low defectives and high credibility, the semiconductor device without cracks can be manufactured.

It is a characteristic of the semiconductor device of the present invention that the trench is formed around the device region. The formation of the trench allows providing a semiconductor device with high credibility without generating cracks in the semiconductor device.

It is a characteristic of the semiconductor wafer of the present invention that the trench is formed around each of the plurality of device regions. The formation of the trench allows providing a wafer on which the semiconductor device without generating cracks is formed.

As further information about technical background to this application, the disclosure of Japanese Patent Application No. 2003-298478 filed on Aug. 22, 2003 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereafter, embodiments according to the present invention are explained in detail with reference to diagrams.

(First Embodiment)

Figure 2E:
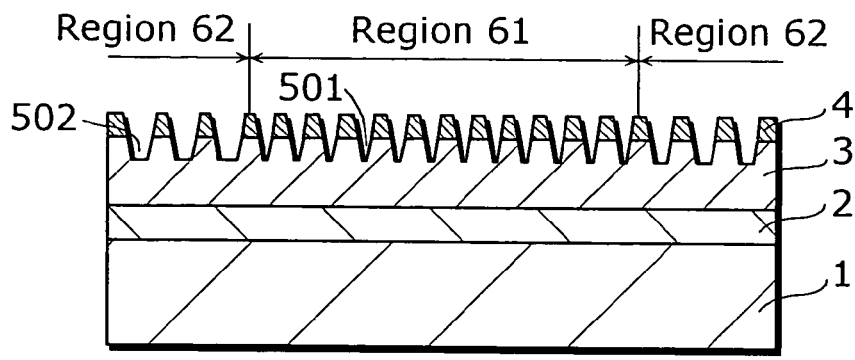
FIGS. 2E to 2G are cross-section diagrams indicating a process of the manufacturing method for the ultraviolet LED device in the first embodiment of the present invention.
Figure 2F:
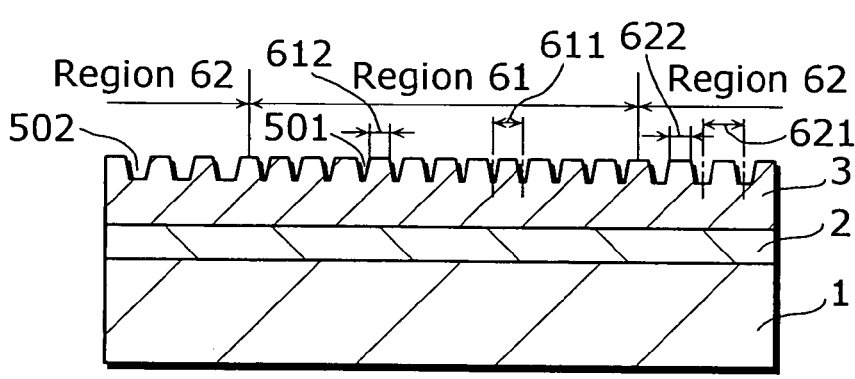
Figure 2G:
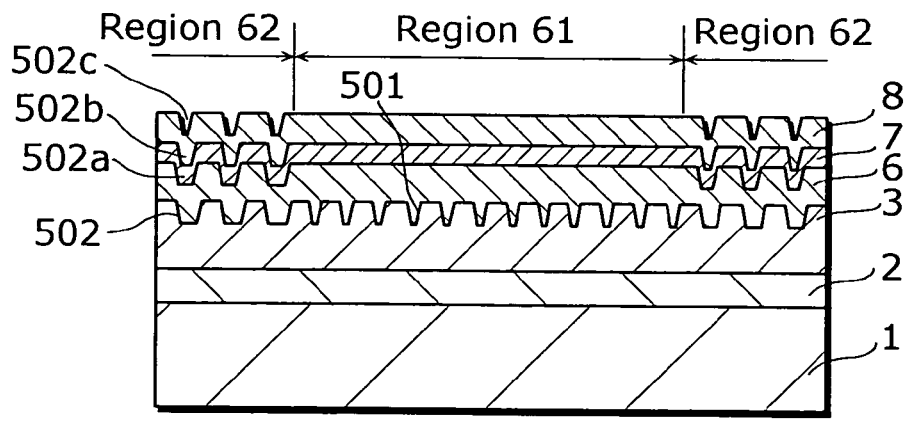
Figure 3H:
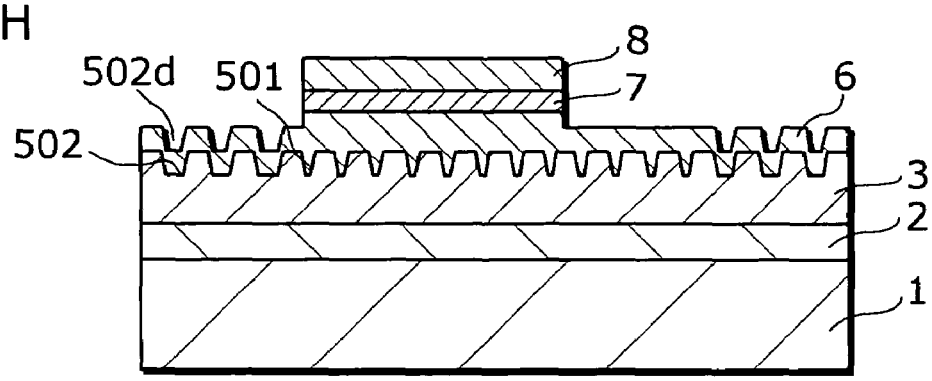
FIGS. 3H to 3J are cross-section diagrams indicating a process of the manufacturing method for the ultraviolet LED device in the first embodiment of the present invention.
Figure 3I:
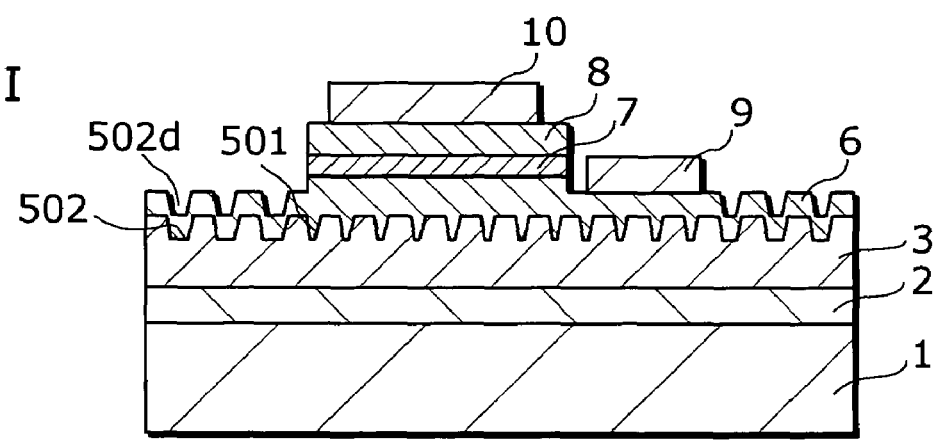
Figure 3J:
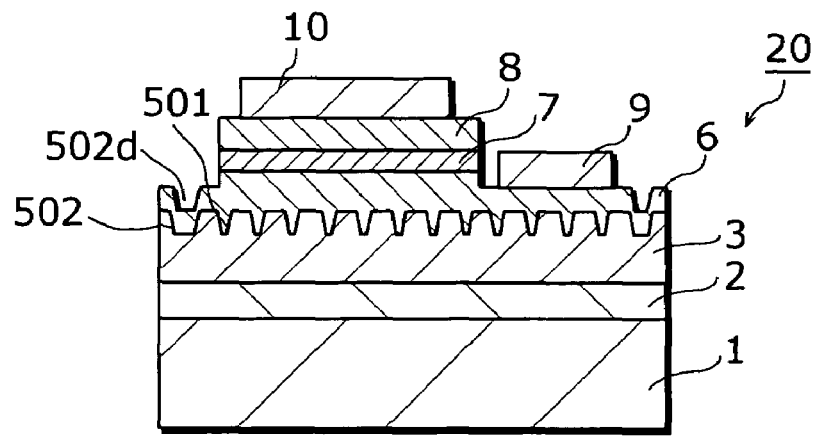

By referring to FIGS. 1 to 7, a manufacturing method for an ultraviolet emitting LED device 20 (refer to following FIG. 3J) in the first embodiment is explained. Here, FIGS. 1 to 3 show a process of the manufacturing method for the ultraviolet LED device 20 in the present embodiment using cross-section diagrams. A substrate 1 shown in FIG. 1A is a n-type 6HSiC whose diameter is 2 inch.

Figure 1A:
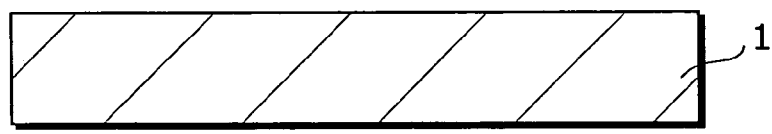
FIGS. 1A to 1D are cross-section diagrams indicating a process of a manufacturing method for an ultraviolet LED device in the first embodiment of the present invention.
Figure 1B:
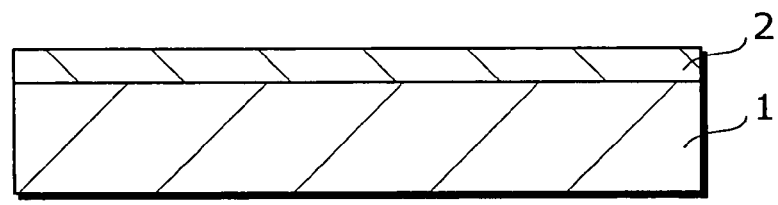

Firstly, an AlN layer 2 is formed in 1 μm thick at a high temperature of 1000° C. on the substrate 1 by a Metal Organic Chemical Vapor Deposition (MOCVD) method using trimethyl aluminum as a III group material, ammonia as a V group material, and hydrogen as a carrier gas (FIG. 1B).

Figure 1C:
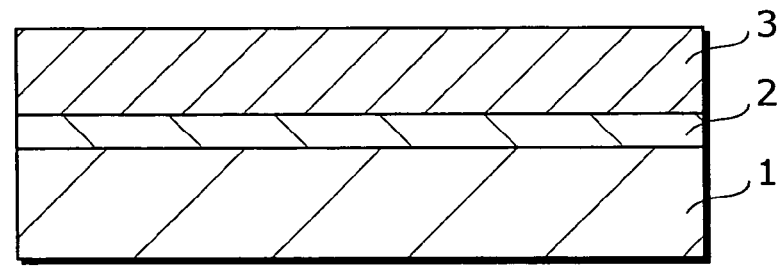

Following that, on the AlN layer 2, a base layer 3 made of n-type $Al_{0.2}Ga_{0.8}N$ is formed in 2 μm thick at a high temperature of 1000° C. (FIG. 1C). Here, AlGaN can be obtained by mixing trimethyl gallium with trimethyl aluminum in an appropriate proportion and growing the mixed. Also, Si, Ge and the like can be used for a n-type dopant and can grow the n-type AlGaN by respectively mixing with mono-silane and mono-germane with a material gas of the MOCVD method. At this time, the thickness of the base layer 3 is made as thin as 2 μm so that a crack is not generated in the base layer 3.

Figure 1D:
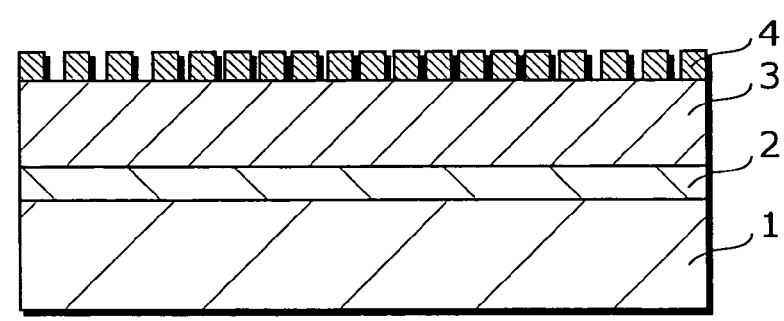

Next, as shown in FIG. 1D, masks 4 by a photoresist are set on the base layer 3. The mask pattern is patterned to cover regions other than regions on which trenches 501 and 502 described later are formed.

Further, by etching the base layer 3 on which the masks 4 are set, striped trenches are formed. In a light emitting region of a LED and a device region 61 where electrodes are formed, the first trenches 501 are formed to make a cycle after the masks 4 are removed (that is, a space between adjacent trenches 611) to be 10 μm and make a width of a flat area 612 to be 8 μm. Also, in a device peripheral region 62 surrounding the device region, the second trenches 502 are formed to make the cycle after the masks 4 are removed (that is, a space between adjacent trenches 621) to be 20 μm and make a width of a flat area 622 to be 13 μm (FIGS. 2E and 2F). Thus, the space between adjacent first trenches 501 is formed to be narrower than the space between adjacent second trenches 502. In here, cross-section diagrams of FIGS. 1 to 3 show diagrams in which a trench is seen from one direction. A formation pattern of the trench is described later in detail. As a method of etching, a reactive ion etching (RIE) using, for example, chlorine gas can be used.

Note that, the masks 4 are removed using organic solvent such as acetone after the base layer 3 is etched (FIG. 2F).

Next, as shown in FIG. 2G, a n-type first clad layer 6 made of $Al_{0.2}Ga_{0.8}N$ with the thickness of 2 μm, an active layer 7 made of $Al_{0.15}Ga_{0.85}N$ with the thickness of 5 nm, and a p-type second clad layer 8 composed of $Al_{0.2}Ga_{0.8}N$ with the thickness of 0.2 μm are grown using the MOCVD method. Here, Mg and Be can be used for a p-type dopant and respectively can be doped by adding biscyclopenta-dienylmagnesium, biscyclopenta-dienylberyllium and the like to a material of the MOCVD method. Note that, the first clad layer 6, the active layer 7, and the second clad layer 8 are grown epitaxitially on the base layer 3 and plane directions of those layers are same as the plane direction of the base layer 3.

At this time, in the device region 61, the width of the flat area 612 of the first trenches 501 formed on the base layer 3 is made small as 8 μm so that the first trenches 501 are embedded and surfaces of the first clad layer 6, the active layer 7, and the second clad layer 8 are nearly flattered.

On the other hand, in the device peripheral region 62, the width of the flat area 622 of the second trenches 502 is determined as 13 μm which is a length that the trenches 502 are not embedded and flattered. Therefore, on the growing n-type first clad layer 6 and on the growing active layer 7, growing trenches 502a, growing trenches 502b, and growing third trenches 502c are formed respectively. When the growth is completed, the third trenches 502c are formed on the surface of the second clad layer 8. In here, as the growth progresses, a width of each trench gets narrower in order of the growing trenches 502a, the growing trenches 502b, and the trenches 502c. Note that, a detail about a dimension of the trenches is described later in detail.

Next, after the p-type second clad layer 8 is annealed by heating it for 10 minutes at 700° C. in a nitrogen atmosphere (not shown in the diagrams), as shown in FIG. 3H, the n-type first clad layer 6 is exposed by the etching. At this time, if an etching such as RIE is used, the etching is being processed at an upper part of the second trenches 502 while maintaining a shape of the third trenches 502c, and fourth trenches 502d having almost same shape as that of the third trenches 502c are formed on the n-type clad layer 6. Here, the active layer 7 and the second clad layer 8 may leave on a side of the fourth trenches 502d depending on the shapes of the second trenches 502 and the fourth trenches 502d. However, it does not affect a characteristic of a component or a crack propagation control to be described later.

Accordingly, the LED of the present embodiment has a process of exposing the n-type first clad layer which is a lower layer. Therefore, the etching needs to be performed in order to form the fourth trenches 502d. The fourth trenches 502d are not formed without the process of exposing the lower layer and the third trenches 502c operate for restraining a propagation of a crack which is described in a fourth embodiment.

Further, as shown in FIG. 3I, a n-type electrode 9 made of Ti/Al and a p-type electrode 10 made of Ni/Au are formed. While the detail about the electrode formation is not shown in the diagram, it is possible to form a metal by evaporation and the like, pattern the metal by the photolithography and select a method of annealing the metal in an atmosphere from 500° C. to 1000° C. In the present embodiment, the SiC is used as the substrate 1 so that the ultraviolet radiation merely transmits from the substrate side. Therefore, it is needless to say that forming the p-type electrode 10 thinly to make it a transparent electrode or a comb-shaped electrode and the like to have a structure which can eject light from the p-type electrode is preferred.

Lastly, as shown in FIG. 3J, the region where the second trenches 502 and the fourth trenches 502d are formed is cut by a dicing saw so that the ultraviolet LED devices 20 is separated into one by one and, what is called, a LED chip is completed.

Here, it is better not to dissipate the LED chip after the cutting by bonding a wafer to a resin film at the time of cutting by the dicing saw.

After that, it is of course better to enclose the ultraviolet LED device 20 in a resin package according to an object and to set a process of surface-mounting the ultraviolet LED device 20 on a resin substrate such as a bakelite.

Figure 4:
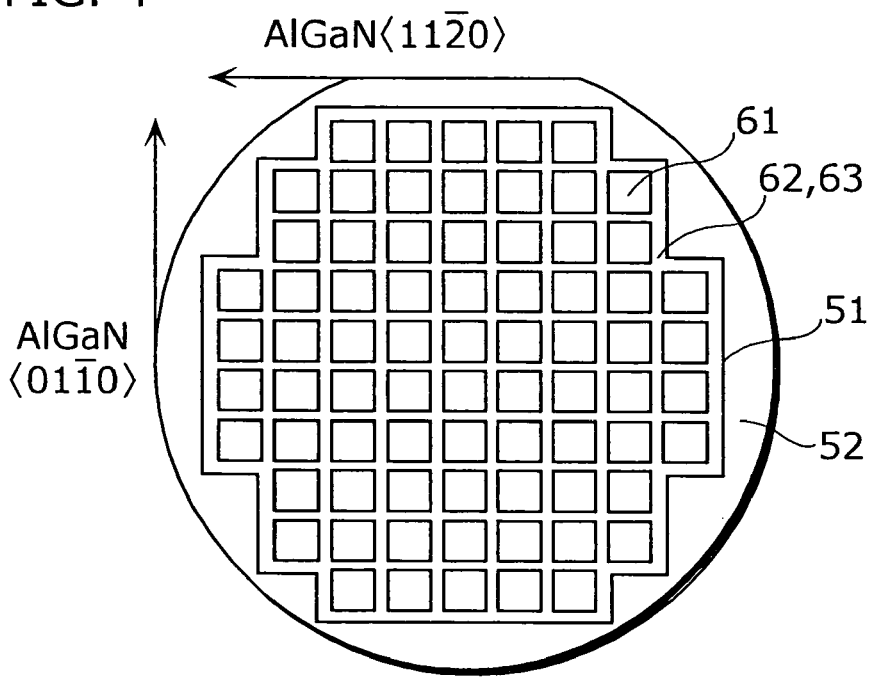
FIG. 4 is a plane diagram showing a semiconductor wafer in the process shown in FIG. 2F.

Next, the formations of the first trenches 501, the second trenches 502 and the third trenches 502 and an effect thereof are explained in detail. FIG. 4 is a plane diagram showing a whole area of the semiconductor substrate in the process shown in FIG. 2F. In the diagram, a direction of AlGaN is shown and a mark indicated with a bar on numbers in the diagram is described using a minus mark as "−1" in this description. Also, FIG. 4 is the diagram conceptually showing an arrangement of a pattern. The arrangement and a size of the pattern in the diagram differ with those in a diagram minimized or enlarged the actual pattern.

In FIG. 4, the surface is the base layer 3. Note that, it is known that a direction of the substrate 1 and a direction of the base layer 3 are rotated in the facet at a 30° angle.

Figure 5:
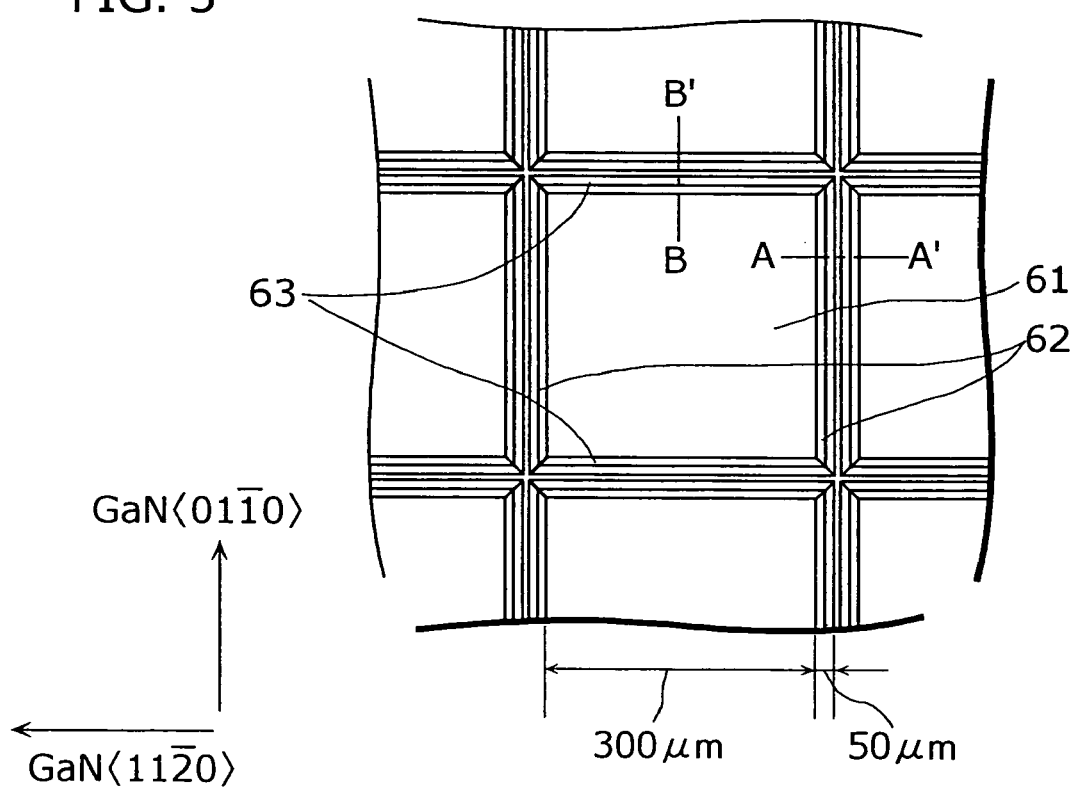
FIG. 5 is an example of an enlarged diagram around one ultraviolet LED device shown in FIG. 4.

In a device region in FIG. 4, as shown in FIG. 5, following regions are repeatedly formed: a device region 61 in which the first trenches 501 are formed; and a device peripheral region 62 and a device peripheral region 63 in which the second trenches 502 are formed. The peripheral region 52 outside the device region 51 is a substrate peripheral region so that a thickness and the like of GaN layers largely vary and it is not appropriate for forming the ultraviolet LED device 20. Since the ultraviolet LED device 20 is not formed in the peripheral region 52, in the present embodiment, the trenches 501 and the trenches 502 are not formed in the peripheral region 52. Note that, FIG. 5 is an example of an enlarged diagram of a peripheral of one of the device region 61 in FIG. 4.

The device region 61 is a region in which a light-emitting region of the ultraviolet LED device 20 and an electrode are formed. In the device peripheral region 62, parallel to a side of the adjacent device region 61, that is, in a direction of the AlGaN<01-10>, the trenches 502 are formed. In the device peripheral region 63, parallel to a side of the adjacent device region 61, that is, in a direction of the AlGaN<11-20>, the trenches 502 are formed.

The device region 61 is a square 300 μm on a side. The widths of the device peripheral region 62 and the device peripheral region 63 are both 50 μm. Except the last outer periphery, the device regions 61 are adjacent to each other so that a width of an area in which the second trenches 502 are formed is 100 μm.

Figure 6:
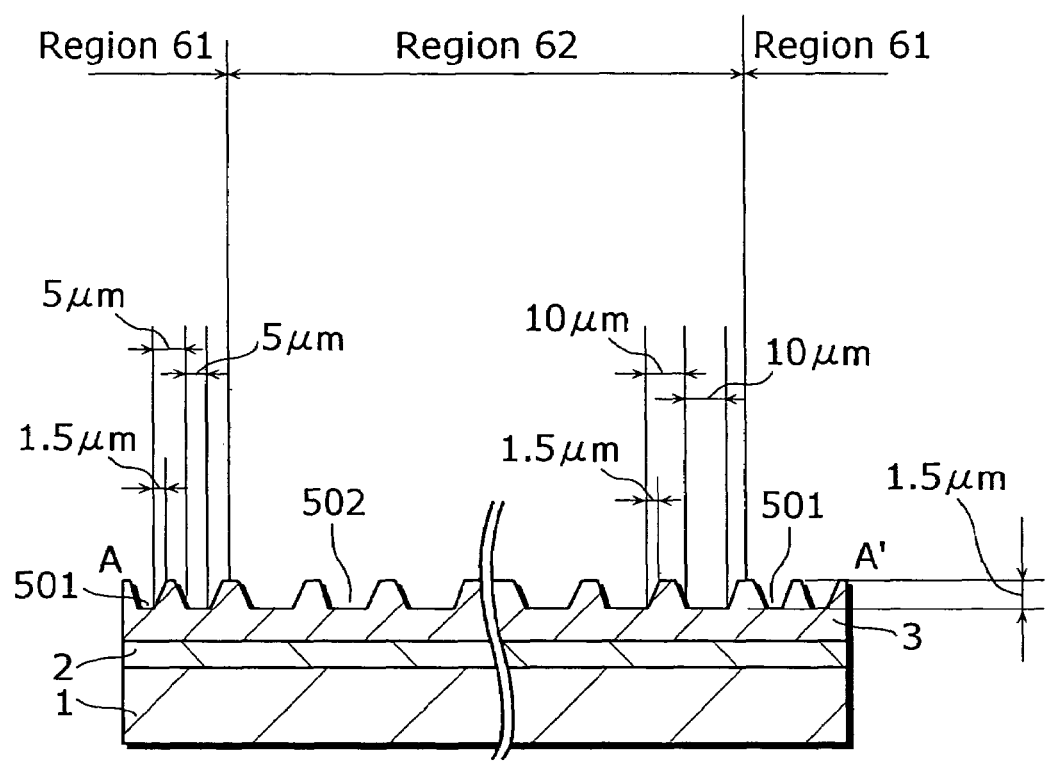
FIG. 6 is a diagram showing a cross-section shape when a trench shown in FIG. 5 is cut on an A–A' line.

FIG. 6 is a cross-section diagram when a trench in the device peripheral region 62 is cut on A–A' line shown in FIG. 5. As shown in FIG. 6, the trenches 501 are striped concavo-convexes formed repeatedly in a 10 μm cycle. The direction of the stripe is <01-10>. Further, a depth of the first trenches 501 is 1.5 μm.

In the present embodiment, a width of a flat area on top of each first trench 501 is 2 μm that is formed 3 μm narrower than a width of the flat area in the bottom part (in other words, to make the width to 1.5 μm). As the result, the width of an opening on the top of each first trench 501 becomes 8 μm. This is because, in the etching by RIE, that not only the base layer 3 but also the masks 4 by a photoresist are etched. Especially when the masks 4 are etched, angular parts of the masks 4 are exposed to more responsive molecules so that the masks 4 are swept back together with the etching and a slope is formed on the base layer 3.

On the other hand, the second trenches 502 in the device peripheral region 62 have a shape of which a striped concavo-convex is repeatedly formed in a 20 μm cycle. The second trenches 502 and the first trenches 501 are formed at the same time. Therefore, due to the similar circumstance as above explained, the second trenches 502 are widened toward the top where the width of the opening is 13 μm.

Consequently, in the case where the first trench 501 and the second trench 502 are formed at the same time, a process of forming a trench completes at once and a condition for an embedding growth becomes same since a shape of a slope at a step of the trench becomes the same in the first trench 501 and the second trench 502. Therefore, controlling a later process becomes easier.

A cross-section diagram in the case where the first trench 501 and the second trench 502 are cut on B–B' line is not shown in the diagrams. However, the device peripheral region 63 has a similar structure as in the case of FIG. 6 (the cross-section diagram in the case where cutting on A–A' line) except in the case where the strip direction is <11-20>. Also, examining closer to the cross-section in the case where cutting on B–B' line, the stripe in the device region 61 is parallel to the cross-section.

Note that, there are no particular restrictions on a direction, a width and a depth of the shape of the trenches in the device region 61 unless it is the shape in which the second clad layer 8 is embedded nearly flat.

It is described further in detail in the following third embodiment about the shapes of the device peripheral region 62 and the device peripheral region 63. Here, it is important for realizing an effect of the present invention to set the trenches 502c to be formed on the second clad layer 8 by widening the width of the trenches than the device region 61.

Specifically, in the present embodiment, a speed of embedding trenches in a horizontal direction is as twice as higher than a speed in a vertical direction. In that case, when the first clad layer 6 grows 2 μm in thick, one side of the step is embedded 4 μm in the horizontal direction, that is, 8 μm is embedded for both sides. As the result, the surface of the first clad layer 6 becomes flat on the device region 61. On the other hand, a width of embedding trenches 502a becomes 5 μm, the trenches 502a being formed on the first clad layer 6 on the device peripheral region 62 and the device peripheral area 63. Further, when the active layer 7 with thickness of 5 nm and the second clad layer 8 with thickness of 0.2 μm are grown, it becomes a flat growth on the first clad layer 6 on the device region 61. On the other hand, on the device frequency region 62 and the device frequency region 63, a width of the trenches is narrowed about 0.8 μm and a width of the third trenches 502c becomes about 4.2 μm. In here, the width of the embedding trenches 502b is about 5 μm since the thickness of the active layer is very thin as thick as 5 nm so that a length of the trench to be narrowed is very small as long as about 0.02 μm.

As explained above in detail, the width of the trenches 502 formed on the surface of the LED chip is 4.2 μm in the end.

In addition, concerning about a setting of a width of trenches in the device region 61, for example, in the case where having a structure in which a crack is generated for the first time after the second clad layer 8 is grown, it is sufficient if the second clad layer 8 is embedded flat. In this case, the first clad layer 6 and the active layer 7 in the device region 61 may have trenches.

Figure 7:
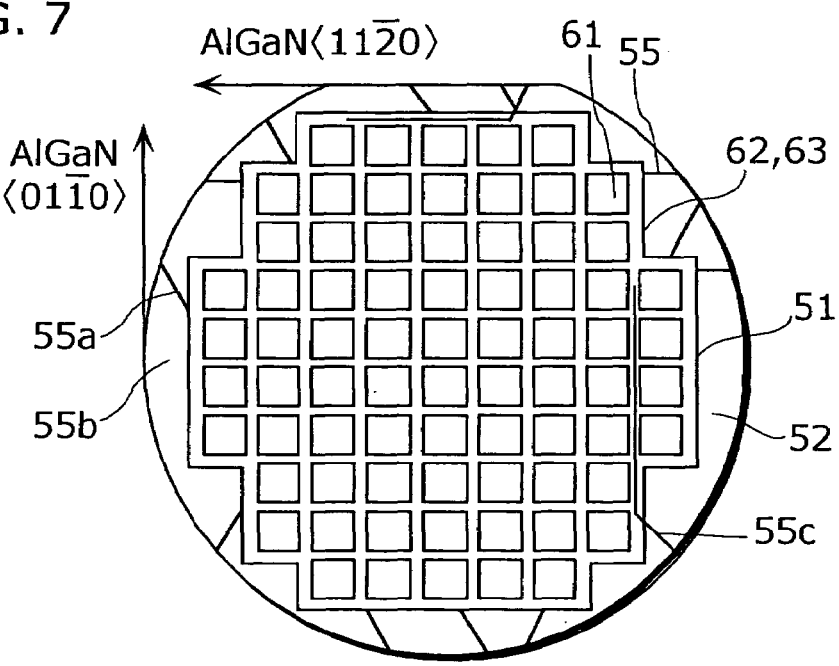
FIG. 7 is a plane diagram of a semiconductor wafer after a MOCVD growth is completed in the first embodiment of the present invention.

FIG. 7 is a plane diagram showing a whole substrate after the p-type clad layer 8 is formed, that is, after a completion of the MOCVD growth. In here, FIG. 7 is a diagram conceptually showing an arrangement of a pattern. Therefore, the arrangement and a size shown in FIG. 7 are different from those in a diagram minimized or enlarged the actual pattern.

In the peripheral region 52, a crack 55 formed on the (01-10) facet of the base layer 3 and an equivalent facet is observed. The crack is generated because, on the AlN layer 2, the base layer 3 of the AlGaN, the n-type clad layer 6, the active layer 7, and the p-type clad layer 8 are grown so that an AlGaN whose lattice constant is large receives a compressed distortion from an AlN whose lattice constant is small. On the other hand, a thermal expansion coefficient of SiC is smaller than that of the AlGaN in all Al group forming area so that the AlGaN receives a pulling distortion in a process of lowering a temperature from a growth temperature to a room temperature. The crack is generated mainly when the pulling distortion is received. Therefore, it is considered that the crack is generated in the AlGaN when a distortion based on a difference between thermal expansion coefficients gets bigger than the distortion based on a difference between the lattice constants. When the pulling distortion is repeated, there are many polished scars around the periphery of the substrate, the scars being generated when shaping lattice defectives and the substrate in a circular. Therefore, it is considered that the crack is generated from the periphery of the substrate to the center resulting from those scars.

On the other hand, a crack is not observed in the device region 61 formed inside the device region 51. This is because that the third trenches 502c are formed in the semiconductor device so that the propagation of the crack to the device region 61 is prevented. As a further detailed mechanism, as the crack 55a in FIG. 7 shows, there are an effect of preventing the propagation of the crack by the third trenches 502c, and an effect that cracks which are generated once such as a crack 55b and a crack 55c propagates along the third trenches 502c so that they do not propagate to the device region 61. Others are an effect that, by forming the third trenches 502c, layers above the first clad layer 6 are divided in plane and a distortion becomes small, and an effect that the amount of crack generation itself is reduced by an effect that a distortion is diversified due to the slopes of the second trenches 502 and the third trenches 502c. A multiple operation of these effects prevents the crack propagation to the device region 61.

Here, in order to make the crack easy to propagate along the third trenches 502c, it is necessary to appropriately select a depth and a width of the third trenches 502c. As for the depth, the depth around 10 nm or less is as deep as a surface roughness by the growth. Therefore, it is appropriate to determine the depth to 10 nm or more. On the other hand, it is preferred to etch deeper so that the crack is unlikely to propagate to the device area 61. However, it may cause a practical problem such as a longer time for the etching. Considering that, it is practical to determine the depth from about 0.5 μm to 5 μm.

As for the width of the third trenches 502c, the width of 10 nm or less is almost as wide as the surface roughness of the growth. Therefore, it is appropriate to determine the width to 10 nm or more. On the other hand, if the width is 100 μm or more, the crack may out from the trenches and propagate to the device region 61. Therefore, it is preferred to determine the width of the trenches to 100 μm or less. While a region for forming the trenches 502d is not a region for forming the device, the narrower the trenches is better for forming the device efficiently on a wafer. Consequently, it is practical to determine the width from about 0.5 μm to 50 μm.

Note that, following two processes should be considered as a cause of the generation of the crack: i) during the growth as described above; and ii) the process of cooling a temperature to a room temperature after growing at 1000° C. In order to prevent the generations of the crack, as an order of forming the second trenches 502, it is important to form the trenches before the first clad layer 6 grows.

Also, as a rare example, when growing, on the base layer, a layer whose lattice constant is smaller than that of the base layer and a layer whose lattice constant is larger, a crack by the pulling distortion is likely to be generated in the layer whose lattice constant is small so that it is necessary to leave trenches during the growth. On the other hand, the compression distortion is added to the layer whose lattice constant is large and a structure which does not need to prevent the crack generation is considered. In such case, the trenches 502c may not need to be formed on a top surface.

The first trenches 501 whose cycle is small are formed on the base layer 3 in the device region 61 and the active layer 7 is formed on where the first trenches 501 are embedded. Therefore, there are no trenches to promote the propagation of the crack on the surface of the second clad layer in the device region 61, which contributes to the prevention of the crack propagation to the device region 61.

Here, according to such effect, it is ideal that the surface of the second clad layer 8 in the device region 61 to be completely flat. However, in reality, very thin trenches and a hollow called a pit are sometimes left on the surface of the second clad layer 8. It is preferred to make the left trenches and the pit smaller than the third trenches 502*c* in order to prevent the crack propagation. For example, it is preferred to determine the width of the left trenches and pit to about one-fifth of the width of the third trenches 502*c* or less.

Accordingly, in particular by the effect of dividing the layers in plane and the effect of propagating the generated crack along the third trenches 503*c*, it become possible to form a semiconductor device that combines a substrate and layers which are, in general, difficult to form a semiconductor device without a crack since the lattice constant difference and the thermal expansion coefficient difference are big.

Consequently, it is needless to say that the crack 55 propagates not only to a peripheral region 52 but also to inside the device region 51 and almost all devices causes operational defectiveness if the cycle of the trenches in the device peripheral region 62 and the device peripheral region 63 in FIGS. 1 to 3, FIGS. 5 and 6, or thicken the first clad layer 6 to have a structure in which the trenches 502 are completely embedded.

As described above, the first trenches 501 whose cycle is small are formed in the device region 61 and the active layer 7 is formed on which the first trenches 501 are embedded. Therefore, a low defective region is formed in the active layer 7. Here, when a embedded growth of a III group nitride semiconductor layer is performed on the substrate where steps are formed on the surface, a low defective region is formed on the m group nitride semiconductor layer. It is described as in Japanese Laid-Open Patent Publication application No. 3201475. Also, as a method of forming steps, following methods and the like can be selected: a method of forming steps directly on a substrate before growing the III group nitride semiconductor, that is a sapphire substrate in the present embodiment; and, as in the present embodiment, a method of forming steps on the III group nitride semiconductor after growing the III group nitride semiconductor on the surface of the substrate.

The formation of such low defective region has an effect of extending the life of the semiconductor and increasing the light-emitting intensity.

That is, the structure of the present invention has an effect that, while preventing the crack by the lattice constant difference and by the thermal expansion coefficient difference, the structure has the low deficient region so that a long-life and high-efficient device can be formed. In addition, there is an effect that the structure requires fewer processes since the low defectiveness specific trench and the crack propagation preventing trench at the same time.

Next, a formation of the fourth trenches 502*d* is explained.

As described above, the fourth trenches 502*d* are formed in the case where there is the process of exposing the lower layer as shown in FIG. 3H. The fourth trenches 502*d* are formed in a shape which is almost same as the shape of the third trenches 502*c* when the etching progresses as at almost same speed in all regions as in RIE. The fourth trenches 502*d* are effective for preventing the crack generation because of stress at the time of the electrode formation shown in FIG. 3I and for increasing credibility after forming the device which is described later in the fourth embodiment.

Then, the chip separation by the dicing saw is explained.

The width of formed second trench 502 and forth trench 502*d*, that is, a space between adjacent device regions 61 shown in the plane diagram of FIG. 5 becomes 100 μm.

Therefore, if a width of a blade of the dicing saw is set to less than 100 μm, the ultraviolet LED device 20 can be separated without cutting the device region 61.

That is, according to the present embodiment, by forming the second trenches 502, the generation of the crack at the time of the growth can be prevented. Additionally, the crack generated in the device region 61 is prevented without setting any restrictions to the device region 61 by using the region of the second trenches 502 as a width to be cut by the dicing saw.

Note that, in the present embodiment, the MOCVD method is used for the growth of the III group nitride semiconductor. However, it is needless to say that a similar result can be obtained by using a Molecular-Beam Epitaxial (MBE) Method, a Hydride Vapor Phase Epitaxy (HVPE) Method, and other epitaxial methods.

In the present embodiment, the 6HSiC substrate 1 is used. However, in the case where, instead of the 6HSiC, other polytype substrates such as a SiC substrate, a sapphire substrate, a Si substrate, a GaN substrate, and an AlN substrate, or a substrate on which those crystals are laminated are used, it is needless to say that a circumstance of preventing the crack by forming the trenches 502 is the same, even if a film thickness which generates the crack differs in relation to the thermal expansion coefficient and the lattice constant.

Also, in the present embodiment, the AlN layer 2 that grows at a high temperature contacting the substrate 1 is formed. However, it is needless to say that, instead of it, a low temperature AlN buffer layer, a nitriding of the substrate surface, a GaCl process on the substrate surface, and the like can be used.

Further, in the present embodiment, the photoresist is used as masks 4 of the RIE. However, it is needless say that, instead of the photoresist, derivatives such as SiO2 and Sin, metals such as Ni and Al, and a film on which those derivatives and metals are laminated may be used. At this time, it is needless to say that the slope formed on the base layer 3 gets closer to plumb when materials such as SiO2 that are unlikely to be etched are used instead of the photoresist. At the time, as the slope gets closer to the plumb, it becomes difficult to distribute the materials to the bottom of the slope and a blank space is sometimes formed. However, the crack prevention effect is not lost despite the formation of the blank space. Rather, the distortion is moderated a little so that it is effective for the crack prevention.

In the present embodiment, the ultraviolet LED device 20 composed mainly of the AlN and AlGaN is shown as an example. However, it is needless to say that, in replace of the ultraviolet LED device, a LED device or a LD device for ranges from a visible light to an ultraviolet light, a high-speed transistor and the like can be similarly applied when the crack and a density of the defectives cause problems. In that case, other III group nitride semiconductor materials can be used according to a light-emitting frequency and a transistor structure. Specifically, GaN, InGaN, AlGaInN and the like can be used instead of AlN and AlGaN.

Note that, in the case of the LD device, a mode is influenced when trenches are formed in a direction of a resonator. Therefore, it is needless to say that the trenches formed in the direction of the resonator may be cut by a cleavage, a dicing, a scribing and the like if necessary.

(Second Embodiment)

By referring to FIGS. 8 to 14, a manufacturing method for the ultraviolet LED device 30 (refer to FIG. 10J) in the second embodiment is explained. In the present embodiment, an example which is effective for the crack prevention without forming steps for low defectives in the device region 61 is explained.

Figure 8A:
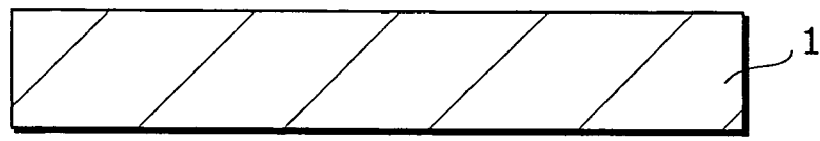
FIGS. 8A to 8D are cross-section diagrams showing a process of a manufacturing method for an ultraviolet LED device in the second embodiment of the present invention.

FIG. 8A is a cross-section diagram of the substrate 1.

Figure 8B:
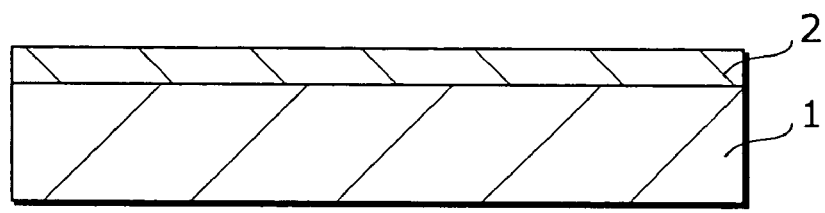

On the substrate 1 made of the n-type 6HSiC, the AlN layer 2 is formed to have a thickness of 1 μm by the MOCVD method (FIG. 8B).

Figure 8C:
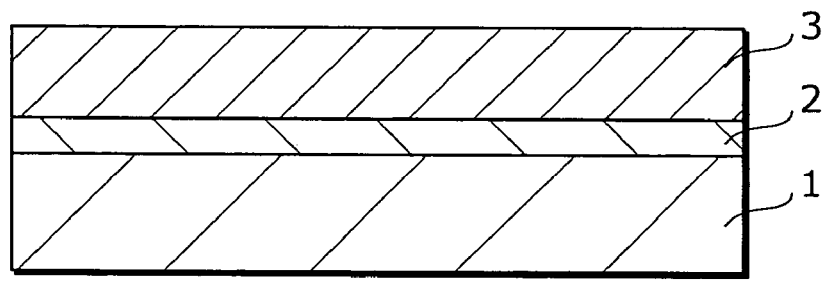

Next, on the AlN layer 2, the base layer 3 made of the n-type $Al_{0.2}Ga_{0.8}N$ is formed to have a thickness of 2 μm (FIG. 8C).

Figure 8D:
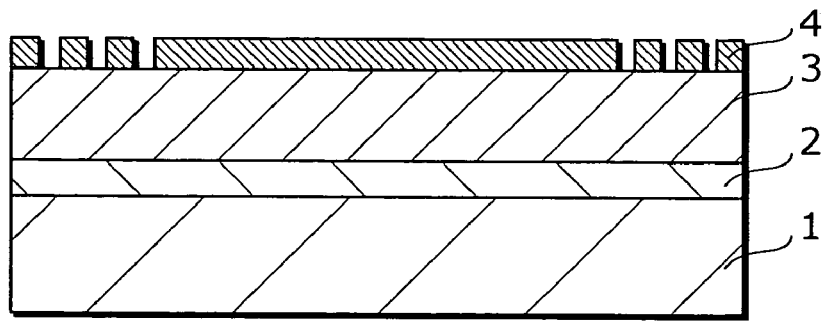

As shown in FIG. 8D, the masks 4 are formed on the base layer 3 by the photoresist. The mask pattern is patterned to cover all regions except where the trenches 502 are formed and steps are not set intentionally in the device region 61, the trenches 502 being discussed later.

Figure 9E:
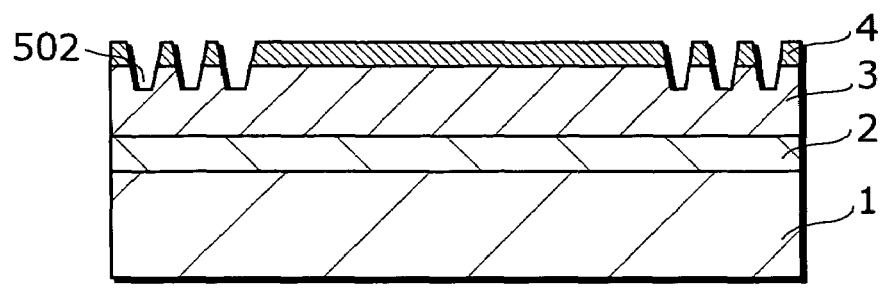
FIGS. 9E to 9G are cross-section diagrams showing a process of the manufacturing method for the ultraviolet LED device in the second embodiment of the present invention.

Further, the trenches 502 are formed by setting the masks 4 and etching the base layer 3 using RIE and the like. There are no trenches in the device region 61 and the striped trenches whose cycle is 20 μm are formed in the device peripheral region 62 of the LED (FIG. 9E).

Figure 9F:
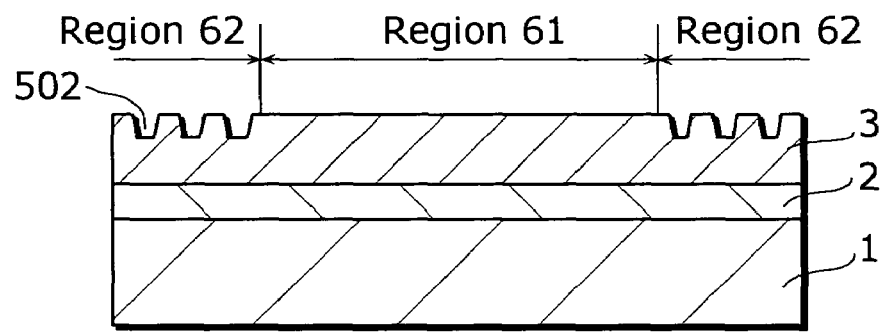

After the etching, the masks 4 are removed using the organic solvent such as acetone (FIG. 9F).

Figure 9G:
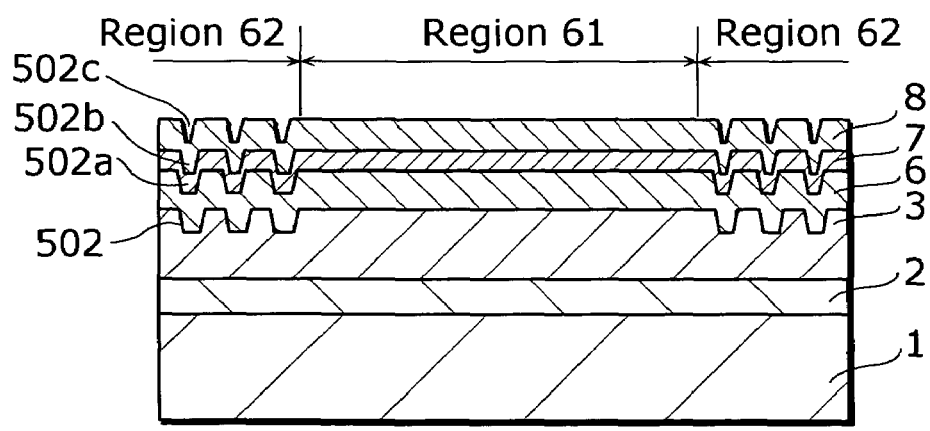

Next, as shown in FIG. 9G, the n-type first clad layer 6 made of $Al_{0.2}Ga_{0.8}N$ with the thickness of 2 μm, the active layer 7 made of $Al_{0.14}Ga_{0.84}In_{0.02}N$ with the thickness of 5 nm, and the p-type second clad layer 8 made of $Al_{0.2}Ga_{0.8}N$ with the thickness of 0.2 μm are grown using the MOCVD method. Here, AlGaInN can be obtained by combining the trimethyl gallium, the trimethyl aluminum and the trimethylindium at an appropriate proportion and grow the layers.

In the device peripheral region 62, the width of the second trenches 502 are set wide not enough to embed and flat the trenches as described later. Therefore, the embedding trenches 502a, the embedding trenches 502b, and the third trenches 502c are formed respectively on the n-type first clad layer 6, the active layer 7, and the second clad layer 8.

Figure 10H:
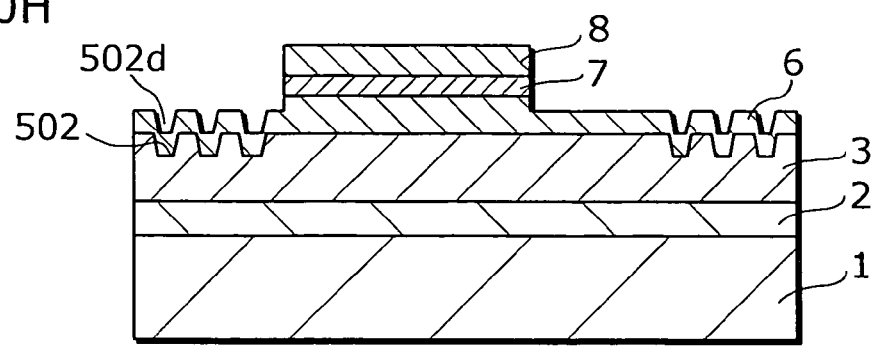
FIGS. 10H to 10J are cross-section diagrams showing a process of the manufacturing method for the ultraviolet LED device in the second embodiment of the present invention.

Then, as shown in FIG. 10H, the n-type first clad layer 6 is exposed by an etching after the p-type second clad layer 8 is annealed to activate acceptors for 10 minutes at 700° C. in a nitrogen atmosphere (not shown in the diagrams). The fourth trenches 502d are formed in the n-type first clad layer 6.

Figure 10I:
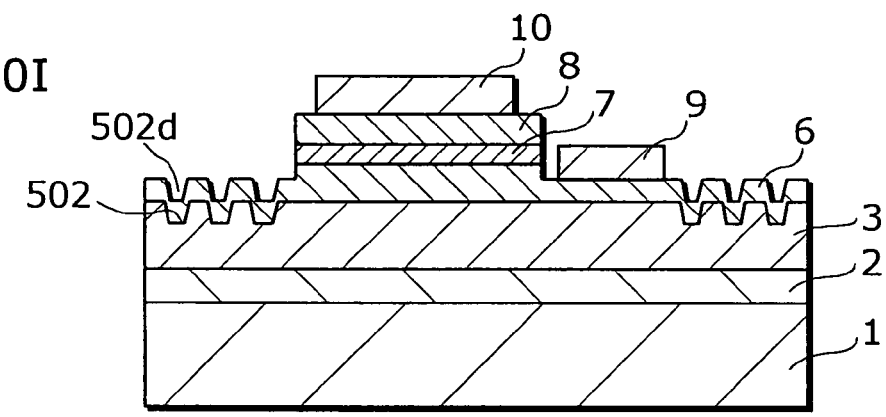

Further, as shown in FIG. 10I, the n-type electrode 9 made of Ti/Al and the p-type electrode 10 made of Ni/Au are formed.

Figure 10J:
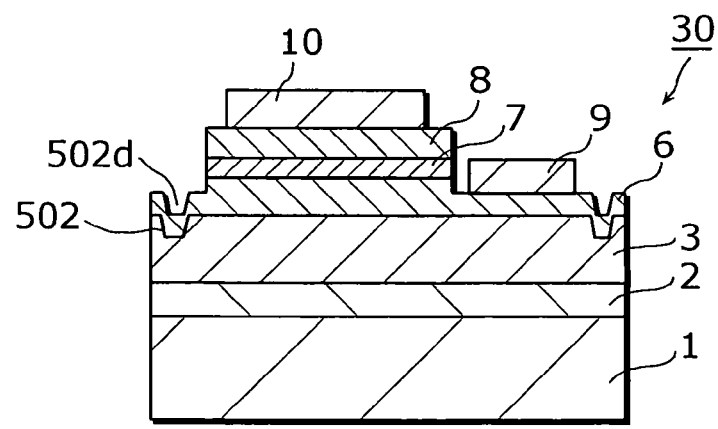

Lastly, as shown in FIG. 10J, the LED chip is completed by cutting the ultraviolet LED devices 30 one by one using the dicing saw along the region where the fourth trenches 502d are formed.

Figure 11:
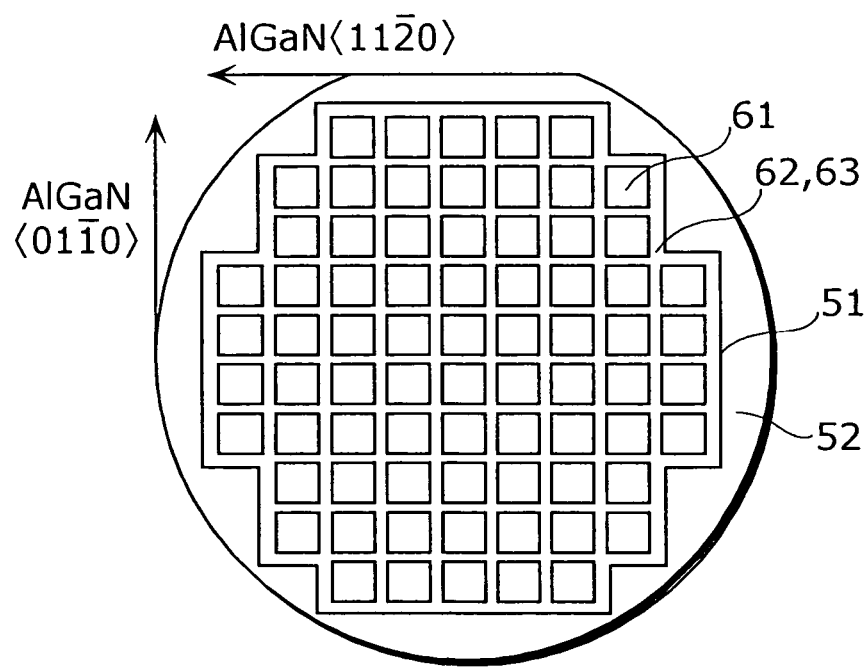
FIG. 11 is a plane diagram showing a semiconductor wafer in a process shown in FIG. 9F.

FIG. 11 is a plane diagram showing the whole semiconductor substrate in the process shown in FIG. 9F. Here, FIG. 11 is a diagram showing conceptually an arrangement of a pattern. Therefore, the arrangement and a size shown in FIG. 11 is different from those in the diagrams minimized or enlarged the actual pattern.

Similar to the first embodiment, the first trenches 501 and the second trenches 502 are formed in the device region 51 and no trench is formed in the peripheral region 52. Also, the LED device pattern is formed repeatedly in the device region 51.

Figure 12:
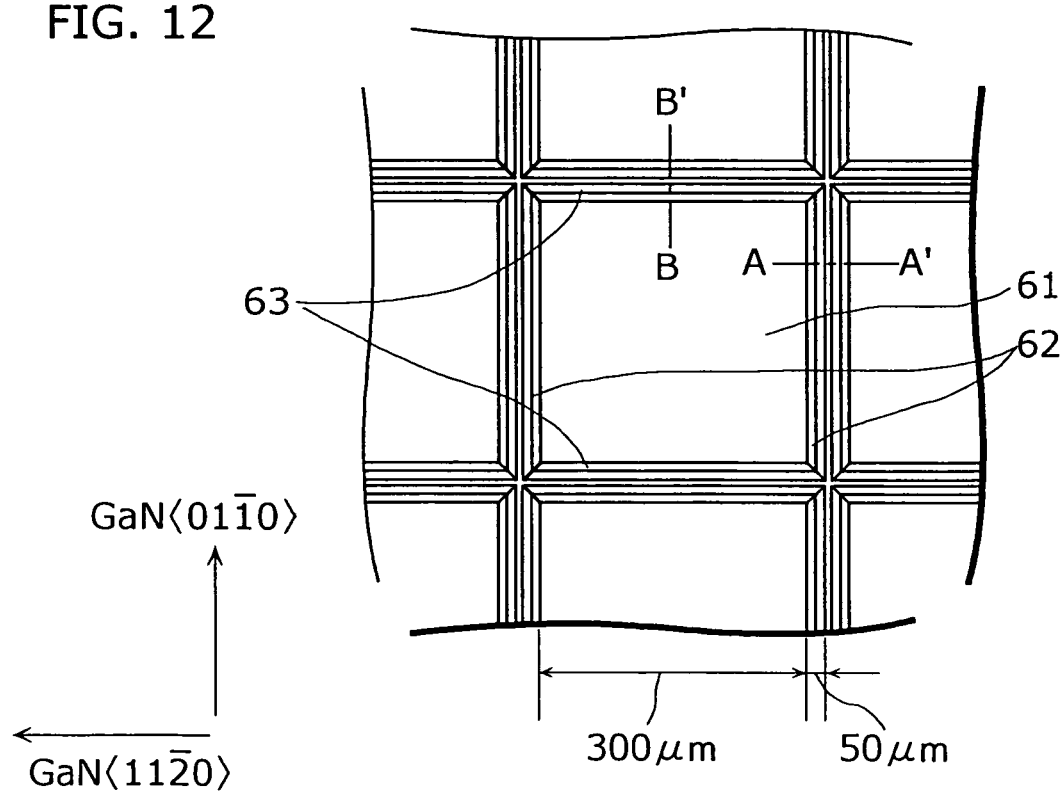
FIG. 12 is an enlarged diagram around one ultraviolet LED device shown in FIG. 11.

FIG. 12 is a detailed diagram around the LED device. The device region 61 is a region in which the ultraviolet LED device 30 is formed. In the device peripheral region 62, the second trenches 502 are formed parallel to sides of the adjacent device regions 61, that is, in the direction of GaN<01-10>. Also in the device peripheral region 63, the second trenches 502 are formed parallel to the sides of the adjacent device regions 61, that is, in the direction of the GaN<11-20>.

The device region 61 is a square on 300 μm a side. The widths of the device peripheral region 62 ant the device peripheral region 63 are both 50 μm. Except the last outer periphery, the device regions 61 are adjacent to each other so that the widths of the device peripheral regions are 100 μm.

Figure 13:
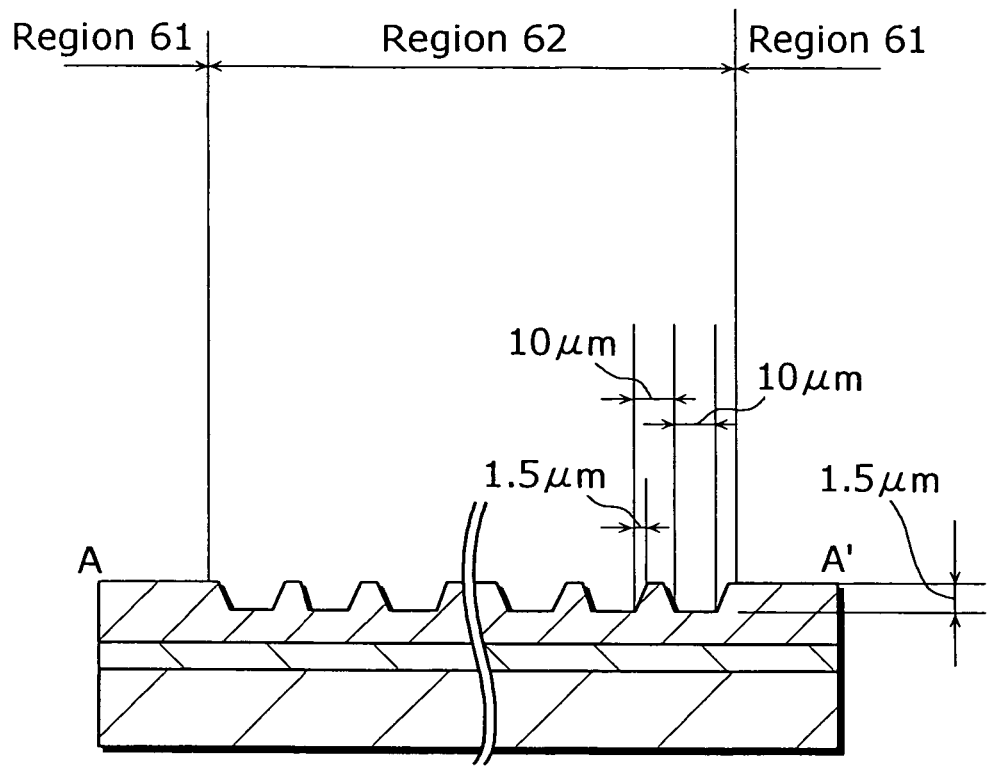
FIG. 13 is a diagram showing a cross-section shape when a trench shown in FIG. 12 is cut on an A–A' line.

FIG. 13 shows a cross-section diagram when the trench 62 is cut on A–A' line shown in FIG. 12. There are no trenches formed in the region 61. In the region 62, the second trenches 502 have a striped concavo-convex formed repeatedly in a 20 μm cycle.

The cross-section diagram in the case where the trench 63 is cut on the B–B' line shown in FIG. 12 is not shown in diagrams, the region 63 has a similar structure of the shape of the cross-section when cutting on the A–A' line except when the stripe direction is in the direction of <11-20>.

Figure 14:
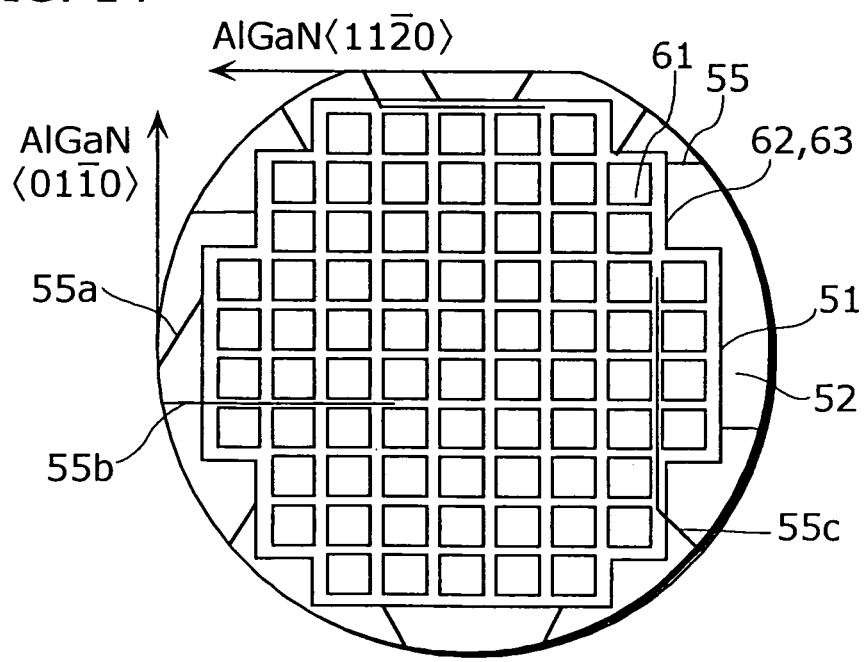
FIG. 14 is a plane diagram of the semiconductor wafer after the MOCVD growth is completed in the second embodiment of the present invention.

FIG. 14 shows a plane diagram of a whole substrate after the p-type clad layer 8 is formed, that is, after the completion of the MOCVD growth. Here, FIG. 14 is a diagram conceptually showing the arrangement of the pattern. FIG. 14 is different in an arrangement and a size in the diagrams minimized or enlarged the actual pattern.

In the peripheral region 52, the crack 55 is observed, the crack being formed on the (01-10) facet and the equivalent facet of the base layer 3. However, the crack is not observed in the device region 61 inside the device region 51. The third trenches 502c are formed on the semiconductor surface by forming the second trenches 502. For example, as shown in the crack 55a to the crack 55c, the third trenches 502c prevent the crack propagation to the device region 61.

In the ultraviolet LED device 30 of the present embodiment, the low defective region is not formed in the device region 61. However, it can prevent the decline of the light-emitting intensity caused by defectives using alloys which includes In such as AlGaInN.

Further, later the process of exposing the n-type first clad layer (FIG. 10H), the fourth trenches 502d formed corresponding to the third trenches 502c contribute to prevent the crack generated by the stress at the time of forming the electrode and to increase credibility after the device is formed.

(Third Embodiment)

The present embodiment shows an example examined for plane shapes of trenches. Hereafter, a manufacturing method for an ultraviolet LED device 40 (not shown in diagrams) in the present embodiment is explained with reference to FIG. 15 and FIG. 16.

FIGS. 15 and 16 are diagrams showing shapes of trenches to be examined about shapes of a device region 61, a trench region 64 and a convex region 65. Each trench is formed using the exactly same manufacturing method used in the first embodiment (that is, only the shape of the trench 502 shown in FIG. 2F is changed). The trench region 64 shown in FIGS. 15 and 16 applies to the second trench 502 shown in FIG. 2F. The convex region 65 applies to a non-etched region between adjacent second trenches 502 shown in FIG. 2F.

FIGS. 15A to 15E show examples of shapes of trenches which are effective to prevent a crack generation, that is, shapes of trenches by which the crack is not generated in the device region 61.

Figure 15A:
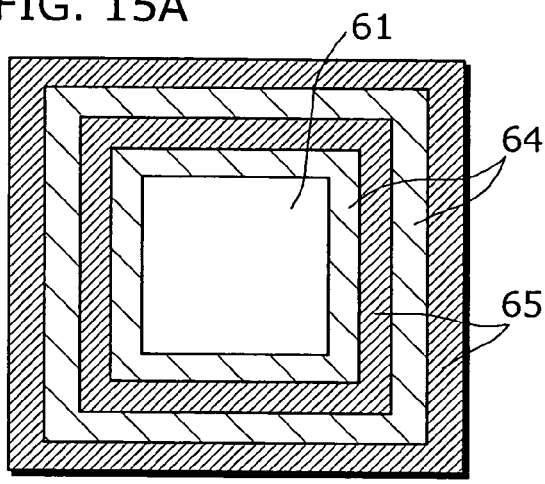
FIGS. 15A to 15E are diagrams showing shapes of the trenches which are effective to prevent the crack generation in a third embodiment of the present invention.

FIG. 15A shows a shape of trenches where the device region 61 is surrounded by two trench regions 64 and convex regions 65 and the shape helps preventing the crack to be caused. The number of trenches can be two as in FIG. 15A, or two or more as shown in the first embodiment.

Figure 15D:
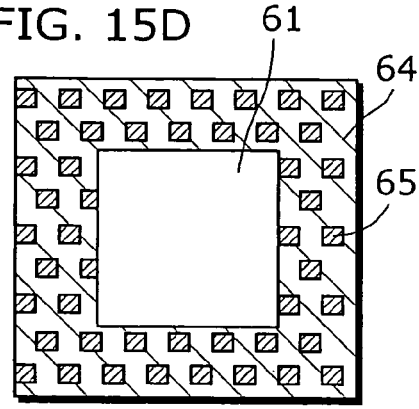
Figure 15B:
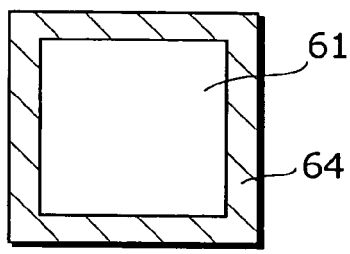

FIG. 15B shows a shape of which the device region 61 surrounded only by one trench region 64. Thus, the crack propagation to the device region 61 is prevented by surrounding the device region 61 by at least one trench region 64. However, in the case where there is only one trench region 64, it becomes more likely to propagate the crack which propagates the trench region 64 to outside the trench region. Therefore, as shown in FIG. 15A, having a plurality of trenches is better.

Figure 15E:
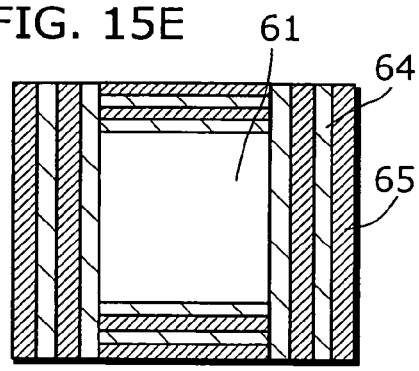
Figure 15C:
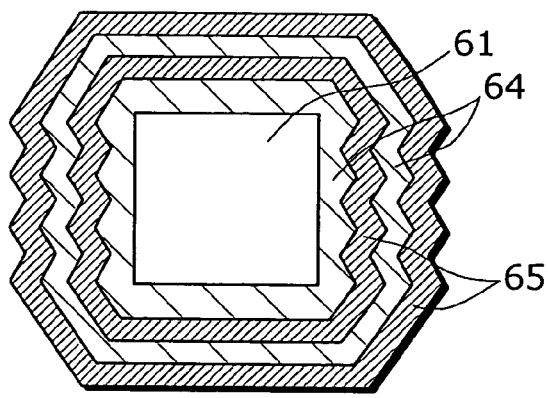

FIG. 15C shows cases where borders between the trench regions 64 and the convex regions 65 are formed in a specific plane direction, for example, the trench regions 64 are formed in a direction equivalent to the <11-20> direction as an axis and where the trench regions 64 are formed in a direction equivalent to the <1-100> direction. In this case, it becomes a pattern surrounded by angles of 60° or 120° because the III group nitride semiconductor has a hexagonal structure. In the III group nitride semiconductor, the most crackable plane is a plane equivalent to the (1-100) plane and the next crackable plane is a plane equivalent to the (11-20) plane. Therefore, in the case where the trench regions 64 in those directions are formed as those specific plane directions, the crack prevention effect is very high.

FIG. 15D shows a shape where the convex regions 65 are scattered in the trench region 64, the shape helps preventing the crack generation.

In FIG. 15E, both sides of the device region 61 are formed with the striped trench regions 64 and convex regions 65 formed in a vertical direction on the paper and a top and a bottom of the device region 61 is formed with the trench regions 64 and the convex regions 65 which have a width as long as one side of the device region 61. In here, the convex regions 61 are striped so that it is easy to form masks.

Figure 16A:
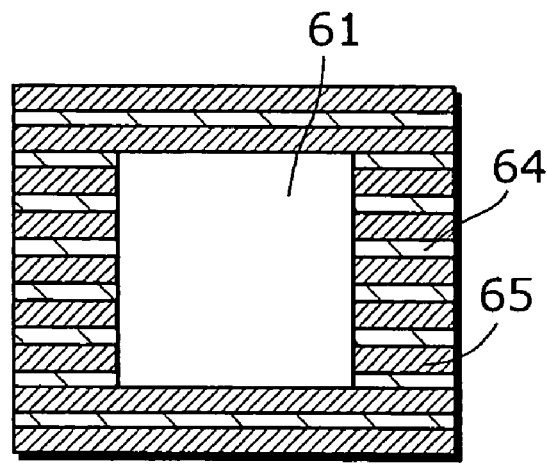
FIGS. 16A to 16C are diagrams showing the shapes of the trenches which are not effective for preventing the crack in the third embodiment of the present invention.
Figure 16B:
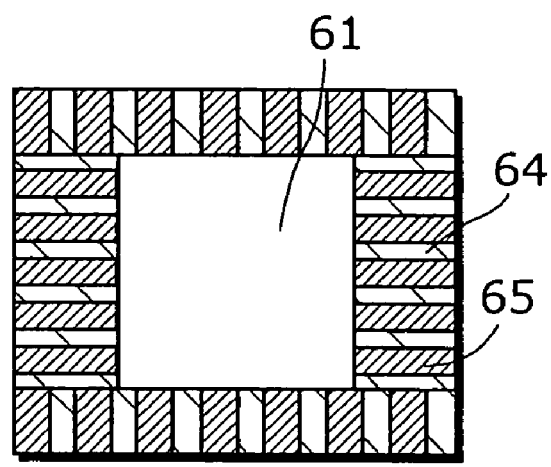
Figure 16C:
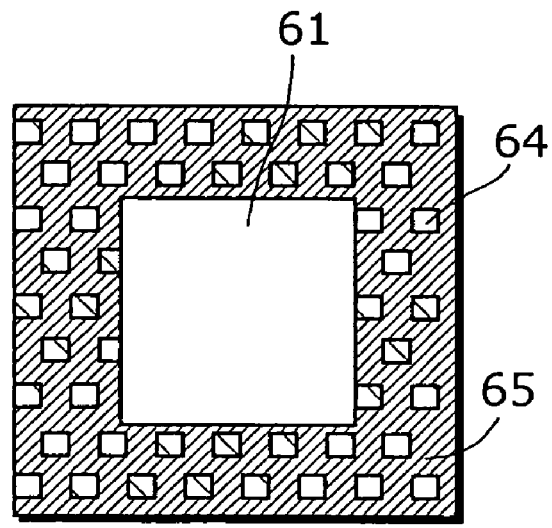

On the other hand, FIGS. 16A to 16C show shapes of the trench regions 64 and the convex regions 65 which are unlikely to prevent the crack generation.

FIG. 16A shows a case where the device region 61 is surrounded by the trench regions 64 and convex regions 65 striped in a vertical direction on the paper. In this shape, the crack is likely to propagate from the direction of right and left on the paper to the device region 61. In particular, when the direction of the stripe is closer to the direction equivalent to the direction in which the crack is likely to be generated, the crack is likely to enter the device region 61.

FIG. 16B shows, contrary to FIG. 15E, a shape that the both sides of the device region 61 are striped in a direction of right and left on the paper and the top and bottom of the device region 61 are striped in a vertical direction. In this shape, the crack is also likely to propagate toward the device region 61.

FIG. 16C shows, contrary to the FIG. 15D, a shape of which the trench regions 64 are scatted in the convex region 65. In this shape, the trench regions 64 are unlikely to prevent the crack propagation.

As described above, a shape of which the device region 61 is surrounded by closed trench regions 64 is highly effective to prevent the crack generation and a shape that the trench regions 64 around the device region 61 are not closed allow the crack to enter the device region 61.

(Fourth Embodiment)

The present embodiment shows an example examined about improving credibility of the LED device by forming trenches, the LED device using the III group nitride semiconductor.

Figure 17A:
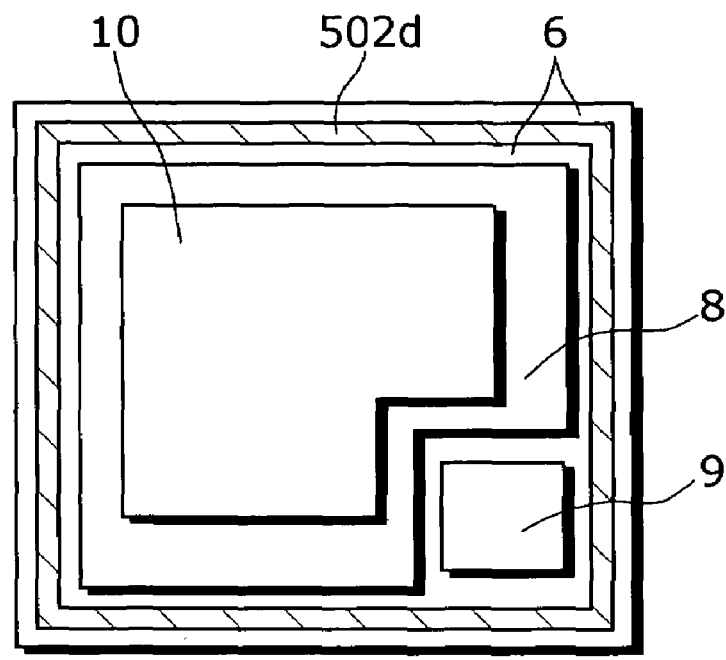
FIG. 17A is a top view of a LED chip in a fourth embodiment of the present invention.
Figure 17B:
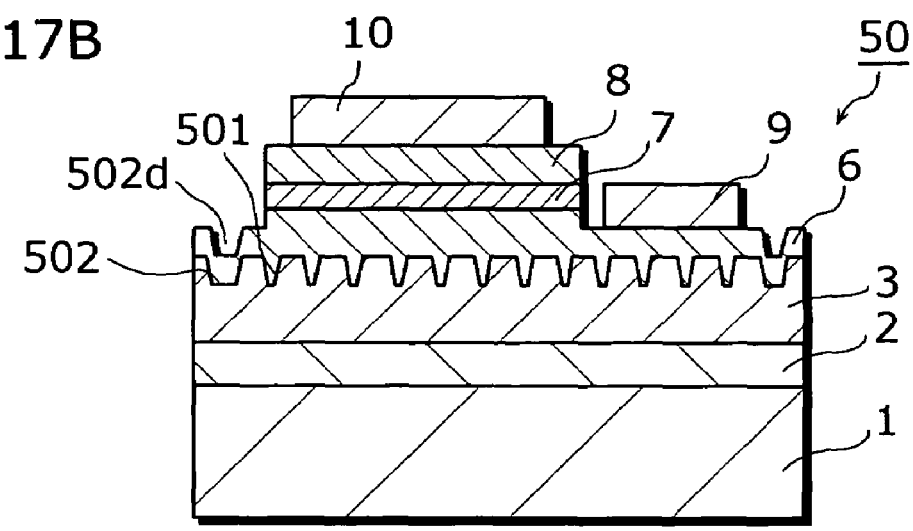
FIG. 17B is a cross-section diagram of the LED chip in the fourth embodiment of the present invention.
Figure 18A:
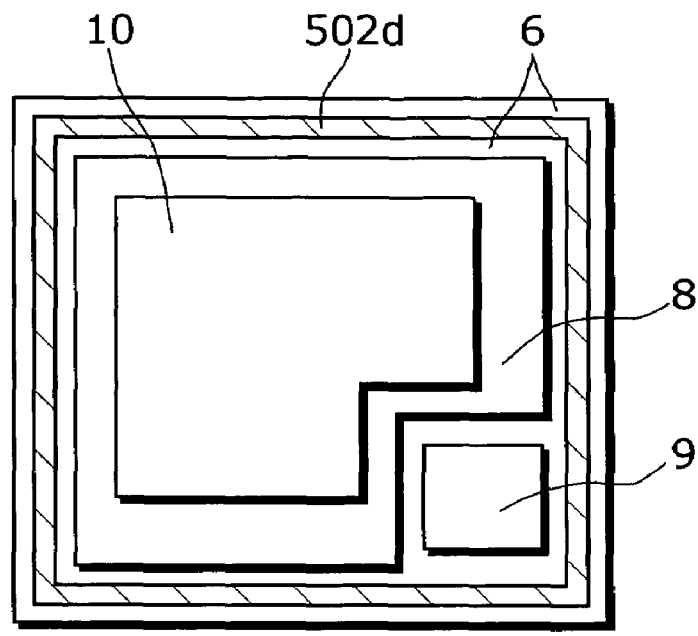
FIG. 18A is a top view of the LED chip in the fourth embodiment of the present invention.
Figure 18B:
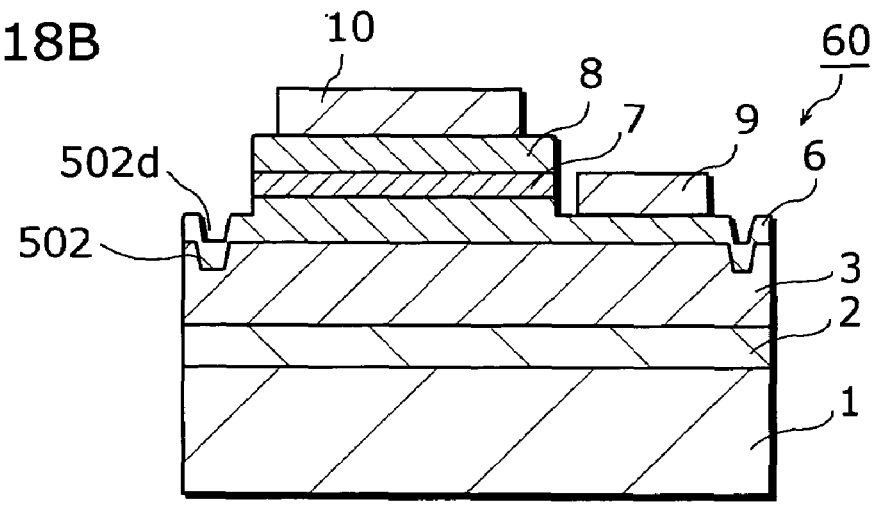
FIG. 18B is a cross-section diagram of the LED chip in the fourth embodiment of the present invention.

Both of the FIGS. 17 and 18 show a plane diagram and a cross-section diagram of the LED chip according to the present invention. FIG. 17 is a diagram showing the LED chip 50 manufactured using the method of the first embodiment. FIG. 18 is a diagram showing the LED chip 60 manufactured using the method of the second embodiment.

Both of the LED chip 50 in FIG. 17 and the LED chip 60 in FIG. 18 have a region where the fourth trenches 502d are formed around the device region 61 to have a width of about 25 μm using a blade with the width of about 50 μm. The fourth trenches 502d are formed in a 20 m cycle so that the device region is surrounded by at least one trench 502d.

Figure 19A:
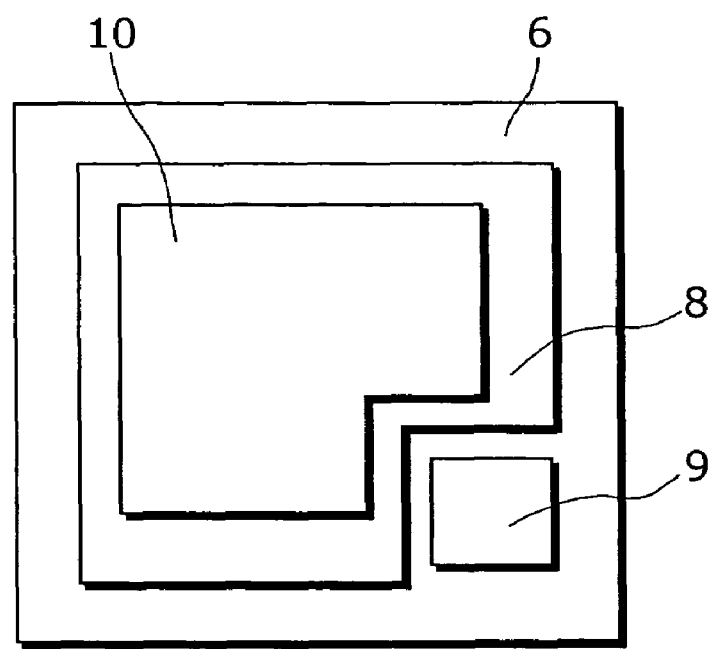
FIG. 19A is a top view of the LED chip in a conventional technology.
Figure 19B:
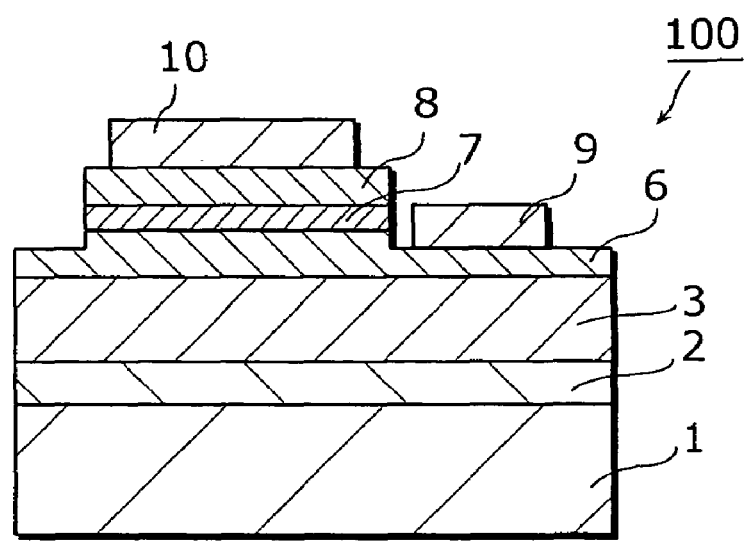
FIG. 19B is a cross-section diagram of the LED chip in the conventional technology.

On the other hand, FIG. 19 are diagrams showing a LED device 100 manufactured without forming the first trenches 501 and the second trenches 502, that is, by the conventional method. As described in the first embodiment, when devices are manufactured by the conventional method, many of the devices cause operational defectives. However, a few devices without a crack exist and those are selected in here.

The credibility of each LED device shown in FIGS. 17, 18 and 19 is verified by a thermal shock test. That is, the LED device is manufactured after repeating a cycle ten times, the cycle being of heating each device up from a room temperature to 400° C. in about 10 seconds inside a lamp reactor and cooling down to the room temperature after the temperature reached 400° C. Examining whether or not the manufactured LED devices evenly emit light, the chips according to the present invention shown in FIGS. 17 and 18 are operated, while a region where light is not emitted because of the crack generation is found in the conventional LED device shown in FIG. 19 and the device causes operational defectives.

As the result, the LED devices according to the present invention in FIGS. 17 and 18 improves credibility concerning a thermal resistance by forming the fourth trenches 502d in order to prevent the crack generation.

Here, in the present embodiment, the credibility is verified by a method of adding heat directly to the chip. However, it is needless to say that the credibility similarly improves in cases such as when a strong pulse current is momentary applied, and when heat is instantaneously generated by applying the present invention to a high-outputted LED device, a semiconductor laser, a high-speed operation transistor and the like.

Further, in the first to fourth embodiments, examples of forming trenches according to a growth process of each semiconductor layer. However, a semiconductor device may be formed on a prepared substrate on which trenches are formed in advance.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

As described above, the manufacturing method for the semiconductor device according to the present invention can be applied to a manufacturing method for a semiconductor device that can avoid an influence of the crack and can manufacture, in quantity, high performance nitride semiconductor device and the like.

What is claimed is:

1. A semiconductor device comprising:
   a substrate;
   a first semiconductor layer formed on said substrate; and
   a plurality of semiconductor layers formed on said first semiconductor layer as a device region,
   wherein a first trench is formed in said first semiconductor layer so as to continuously surround the device region.

2. The semiconductor device according to claim 1, further comprising:
   a second semiconductor layer positioned between said substrate and said first semiconductor layer,
   wherein a second trench is formed in a position corresponding to an outer portion of the device region in said semiconductor layer so as to continuously surround the device region, and
   said second trench is filled with said first semiconductor layer.

3. The semiconductor device according to claim 2, wherein a third trench is formed in a position corresponding to an inner portion of the device region in said semiconductor layer.

4. The semiconductor device according to claim 3, wherein a width of said third trench is narrower than a width of said second trench.

5. The semiconductor device according to claim 3, wherein no trench is formed in a surface of said first semiconductor layer within the device region.

6. The semiconductor device according to claim 5, wherein each of said first trench, said second trench and said third trench includes a plurality of trenches.

7. The semiconductor device according to claim 6, wherein one of said first trench, said second trench and said third trench is further formed in said substrate.

8. The semiconductor device according to claim 2, wherein each of said first semiconductor layer and said second semiconductor layer is made of a group III nitride semiconductor.

9. The semiconductor device according to claim 8, wherein said first semiconductor layer has convex portions around the device region, and
   a part of boundaries between said first trench and said convex portions are formed in a direction equivalent to <11-20>direction or <1-100>direction.

10. The semiconductor device according to claim 2, wherein convex portions are scattered in said first trench.

11. The semiconductor device according to claim 2, wherein each of said first trench and said second trench includes a plurality of trenches.

12. The semiconductor device according to claim 11, wherein one of said first trench, said second trench and a third trench is further formed in said substrate.

* * * * *